US012783415B2

(12) United States Patent
Cheng et al.

(10) Patent No.: US 12,783,415 B2
(45) Date of Patent: Nov. 3, 2026

(54) SELECTABLE PLATFORM POWER LIMITING TO ENABLE EFFICIENT PERSISTENT MEMORY FLUSH

(71) Applicant: Intel Corporation, Santa Clara, CA (US)

(72) Inventors: Kai Cheng, Washougal, WA (US); Divya Gupta, Hillsboro, OR (US); Nikethan Shivanand Baligar, Hillsboro, OR (US); Vivek Garg, Folsom, CA (US); Aurelio Rodriguez Echevarria, Zapopan (MX); Russell J. Wunderlich, Livermore, CO (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/092,278

(22) Filed: Dec. 31, 2022

(65) Prior Publication Data

US 2023/0229594 A1 Jul. 20, 2023

(51) Int. Cl.
*G06F 12/0804* (2016.01)
*G11C 5/14* (2006.01)

(52) U.S. Cl.
CPC .......... *G06F 12/0804* (2013.01); *G11C 5/141* (2013.01)

(58) Field of Classification Search
CPC ........ G06F 1/30; G06F 1/3206; G06F 1/3275; G06F 12/0804; G06F 12/084; G06F 12/0868; G06F 2212/1028; G06F 2212/214; G11C 5/141; G11C 5/148; Y02D 10/10
See application file for complete search history.

(56) References Cited

U.S. PATENT DOCUMENTS

| | | | | |
|---|---|---|---|---|
| 5,414,861 | A * | 5/1995 | Horning | G06F 1/30 365/229 |
| 6,304,981 | B1 * | 10/2001 | Spears | G06F 11/004 714/815 |
| 8,621,252 | B2 | 12/2013 | Fang | |
| 9,223,664 | B1 * | 12/2015 | Watson | G06F 11/2015 |
| 9,690,353 | B2 | 6/2017 | Moran et al. | |
| 9,721,660 | B2 | 8/2017 | Kelly et al. | |
| 10,795,823 | B2 | 10/2020 | Ramanujan et al. | |
| 2006/0015683 | A1 * | 1/2006 | Ashmore | G06F 11/1441 711/135 |
| 2006/0106990 | A1 * | 5/2006 | Benhase | G06F 12/0866 711/E12.04 |
| 2019/0012263 | A1 * | 1/2019 | Jenne | G06F 3/0619 |

* cited by examiner

*Primary Examiner* — Aracelis Ruiz
(74) *Attorney, Agent, or Firm* — Compass IP Law PC

(57) ABSTRACT

A system detects a powerdown event, such as a power loss event, and performs a flush of volatile memory to persistent memory during a powerdown sequence. The system includes an energy backup device to power the system during the powerdown sequence. The system is configurable with optional settings that configure the powerdown sequence specific to a type of the energy backup device.

18 Claims, 9 Drawing Sheets

600

SELECTABLE PLATFORM POWER LIMITING TO ENABLE EFFICIENT PERSISTENT MEMORY FLUSH

TECHNICAL FIELD

Descriptions are generally related to computer systems, and more particular descriptions are related to a powerdown procedure.

BACKGROUND OF THE INVENTION

Some computer systems, especially servers, are designed to operate on alternating current (AC) power. When the AC power is interrupted, the computer can detect the power loss and implement a powerdown procedure to transfer data from volatile memory, such as caches and system memory, to persistent memory. The system can have an energy backup device to provide power for the powerdown procedure.

Typical energy backup devices include supercapacitors and batteries. Batteries provide lower power for a longer duration as compared to supercapacitors, which provide higher power for a short period of time. A computer system can be designed to optimize either for latency or energy efficiency in the backup of data on a power failure event. Energy backup sufficient to support full platform power is not feasible in many scenarios, resulting in the use of power reduction techniques. Different power reduction techniques have differing effects on the energy backup devices. Some power reduction techniques are less effective for different energy backup configurations.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as “in one example” or “in an alternative example” appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION OF THE INVENTION

As described herein, a system detects a powerdown event, such as a power loss event, and performs a flush of volatile memory to persistent memory during a powerdown sequence (also referred to as a shutdown routine). The system includes an energy backup device to power the system during the powerdown sequence. The system is configurable with optional settings that configure the powerdown sequence specific to a type of the energy backup device.

There are electrical limitations in backup energy solutions. Certain solutions use battery technology to deliver backup energy, which typically limits peak power (Watts) while having high total energy (Jules/Watt-hours). Other backup energy solutions use supercapacitors to maximize peak power, while limiting total backup energy and having higher cost. Relying on one solution or the other results in a backup bottleneck (either peak power or total energy). Removing the bottleneck could result in significantly higher backup energy costs.

The configurability of the use of backup power in the powerdown routine provides flexibility in the energy backup solution. The flexibility enables greater management of backup energy cost, while having a powerdown sequence/procedure that provides the services desired to respond to a power loss event. A system can have multiple power reduction options configurable by the user via configuration settings.

Figure 1:
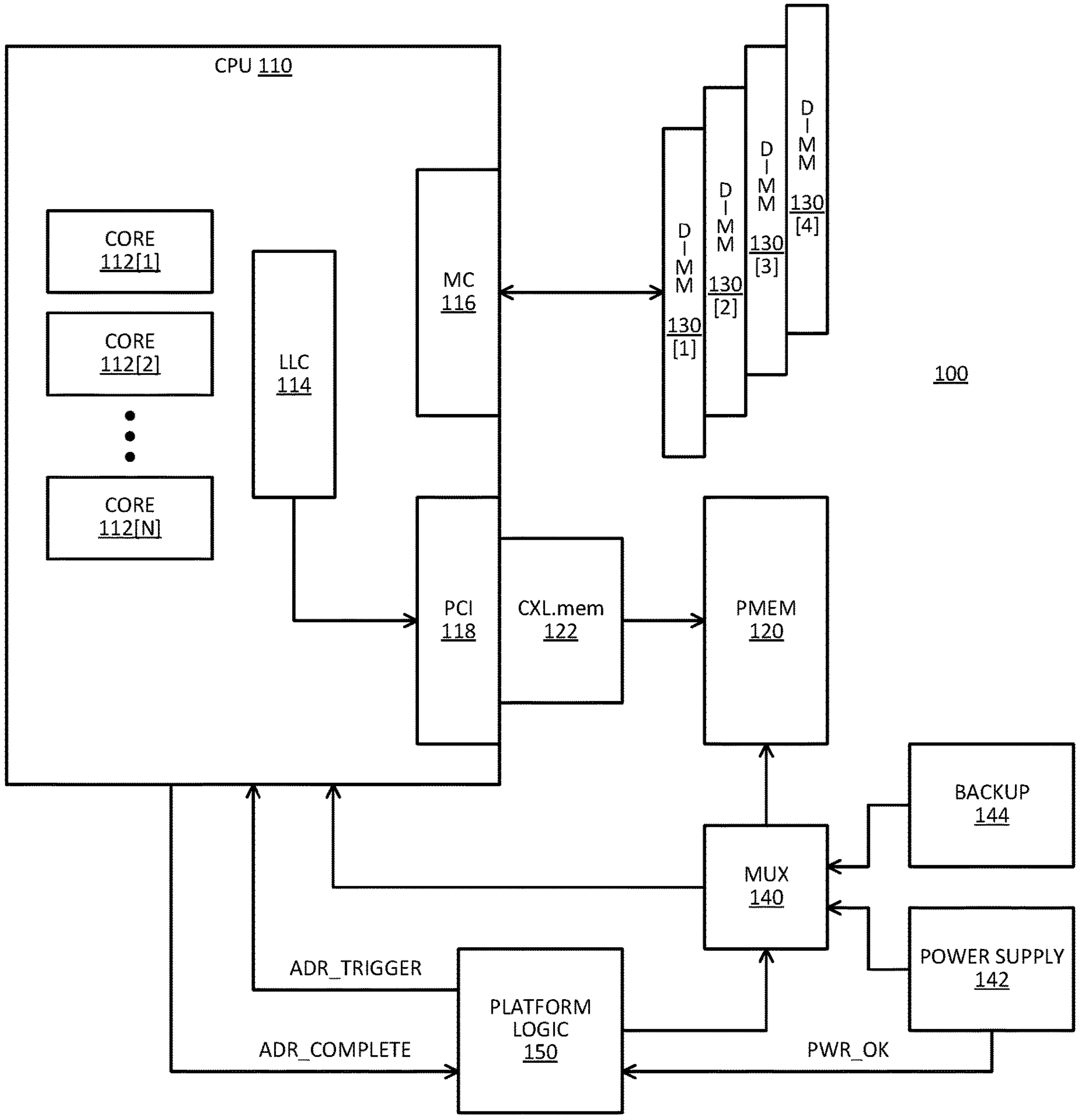
FIG. 1 is a block diagram of an example of datapaths for a system with a powerdown memory flush.

FIG. 1 is a block diagram of an example of datapaths for a system with a powerdown memory flush. System 100 includes central processing unit (CPU) 110 coupled to volatile memory and persistent/nonvolatile memory. Volatile memory can include cache, double data rate (DDR) memory (e.g., DDR version 5 (DDR5) dynamic random access memory (DRAM)), or other memory that needs to be refreshed to maintain state. Persistent memory can include three-dimensional crosspoint (3DXP, such as OPTANE memory of INTEL CORPORATION), flash memory, magnetic-media memory, or other memory that can maintain state without being refreshed. In one example, CPU 110 is mounted in a socket.

CPU 110 includes N cores, core 112[1], core 112[2], . . . , core 112[N], collectively cores 112. Cores 112 represent compute cores for CPU 110, which are the cores that perform the primary compute operations for the system. Last level cache (LLC) 114 represents a cache device shared by cores 112. Cores 112 can each have their own cache hierarchies, with one or more levels of caches dedicated to each core, where LLC 114 stores data from the caches of multiple cores. The caches can store any cacheable addresses, including volatile or persistent addresses. Typically, caches are implemented in volatile memory and the cached data will be lost after powerdown. The data of the cached persistent addresses need to be transferred to persistent memory upon powerdown to be retained.

In one example, CPU 110 includes memory controller (MC) 116 and peripheral component interconnect (PCI) 118. MC 116 represents a circuit to manage access to system memory. In one example, MC 116 is an integrated memory controller (iMC), which is integrated on the processor chip.

System 100 illustrates dual inline memory module (DIMM) 130[1], DIMM 130[2], DIMM 130[3], and DIMM 130[4], collectively DIMMs 130. DIMMs 130 represent volatile system memory. Volatile memory refers to memory that has indeterminate state if power is interrupted. Nonvolatile memory/persistent memory refers to memory/storage that has determinate state even if power is interrupted to the storage device. MC 116 can couple to DIMMs 130 on a system memory bus, including a data bus and a command/address bus. In one example, portions of data from DIMMs 130 can be volatile memory that will be transferred to persistent memory on powerdown.

Persistent memory (PMEM) 120 represents persistent memory coupled to CPU 110. In one example, CPU 110 couples to PMEM 120 over a compute express link (CXL) channel. CXL.mem 122 represents an interface over PCI 118 to interconnect with PMEM 120.

System 100 illustrates multiplexer (mux) 140, which represents circuitry to switch between power supply 142 and backup 144. Power supply 142 represents the AC power supply. Backup 144 represents a backup energy device. During normal operation, power supply 142 powers system 100. During the powerdown sequence, backup 144 provides power to system 100. Backup 144 is a direct current (DC) energy source.

Platform logic 150 represents logic circuitry in system 100 to manage the powerdown procedure. In one example, platform logic 150 is implemented in a platform chip separate from the CPU. In one example, platform logic 150 is implemented on a die of CPU 110, such as a logic die in the CPU. In one example, platform logic 150 is part of an IO die.

Emerging generations of server CPUs have increasing core counts and increasing LLC size. The ability to configure the shutdown behavior of the system provides a backup energy solution that scales with newer server CPUs and hardware platforms. In one example, the data transfer from volatile memory to persistent memory is or is based on fast asynchronous DIMM refresh (fADR), which is a memory flush routine for a double data rate (DDR) DIMM. In one example, the data transfer from volatile memory to persistent memory is or is based on global persistent flush (GPF), which is a memory flush flow for CXL. For purposes of the description herein, the processes for fADR and GPF will be considered interchangeable alternatives.

System 100 provides fADR/GPF power management for powerdown with operations that enable optimization for data flush energy. Power management operations can include, among others: 1) the platform hardware triggers platform level power reductions; 2) the CPU triggers fADR/GPF flush energy reductions; and, 3) PMEM initiates power throttling or bandwidth (BW) throttling, or both power and BW throttling, to reduce peak power.

The different configurable settings can be referred to as knobs, such as selectable configuration settings that can be tuned for power reduction. The knobs can refer to the options to configure power management and power use settings for powering down. Consider a first knob being an option to reduce the number of cores that stay active to perform the powerdown data transfer operations. Other cores can be placed in a low power state, such as a C6 state. A C6 power state or power mode refers to a "deep power down" state that reduces the CPU internal voltage and internally suspends the operation of one or more clocks.

Consider a second knob being an option to reduce DIMM/memory power. In one example, the system puts DIMMs to self refresh before the flush (prior to the flush) of the last level cache (LLC). In one example, the system can reduce the peak bandwidth for a CXL transfer or other persistent memory transfer. In one example, the system can configure a memory range to be covered for flush. In one example, the memory controller can control the addresses to flush.

In one example, for a battery backup, a setting that throttles the persistent memory bandwidth during the flush can reduce the peak bandwidth, which matches better with the energy backup available from the battery. In one example, with a supercapacitor, time is more critical than with a battery, and the setting can be adjusted to not throttle the peak bandwidth, better using the available backup energy of the supercapacitor. Thus, system 100 can have platform hardware execute a powerdown sequence, including managing power usage during powerdown with a policy that is specific to the type of energy backup device.

System 100 illustrates an example of a datapath for a powerdown event. In one example, platform logic 150 monitors a power OK (PWR_OK) signal from power supply 142. In one example, the hardware platform of system 100 has a circuit that monitors the power supply and provides the signal to the platform logic. If PWR_OK indicates a failure of power supply 142, platform logic 150 can switch mux 140 to backup 144.

In one example, in response to the power failure, platform logic 150 generates ADR_TRIGGER to trigger a transfer of volatile memory resources to nonvolatile storage. In one example, cores 112 first flush their core caches to LLC 114. At least one core manages the transfer of data from LLC 114 over a peripheral component interconnect express (PCIe) link through PCI 118 and CXL.mem 122 to PMEM 120. In one example, a single core of cores 112 is enabled to perform the data flush, while the other cores are disabled on powerdown. In one example, if there is data in DIMMs 130 within a range of addresses to be transferred on powerdown, system 100 can transfer the data through MC 116 to PCI 118 to PMEM 120.

Figure 2:
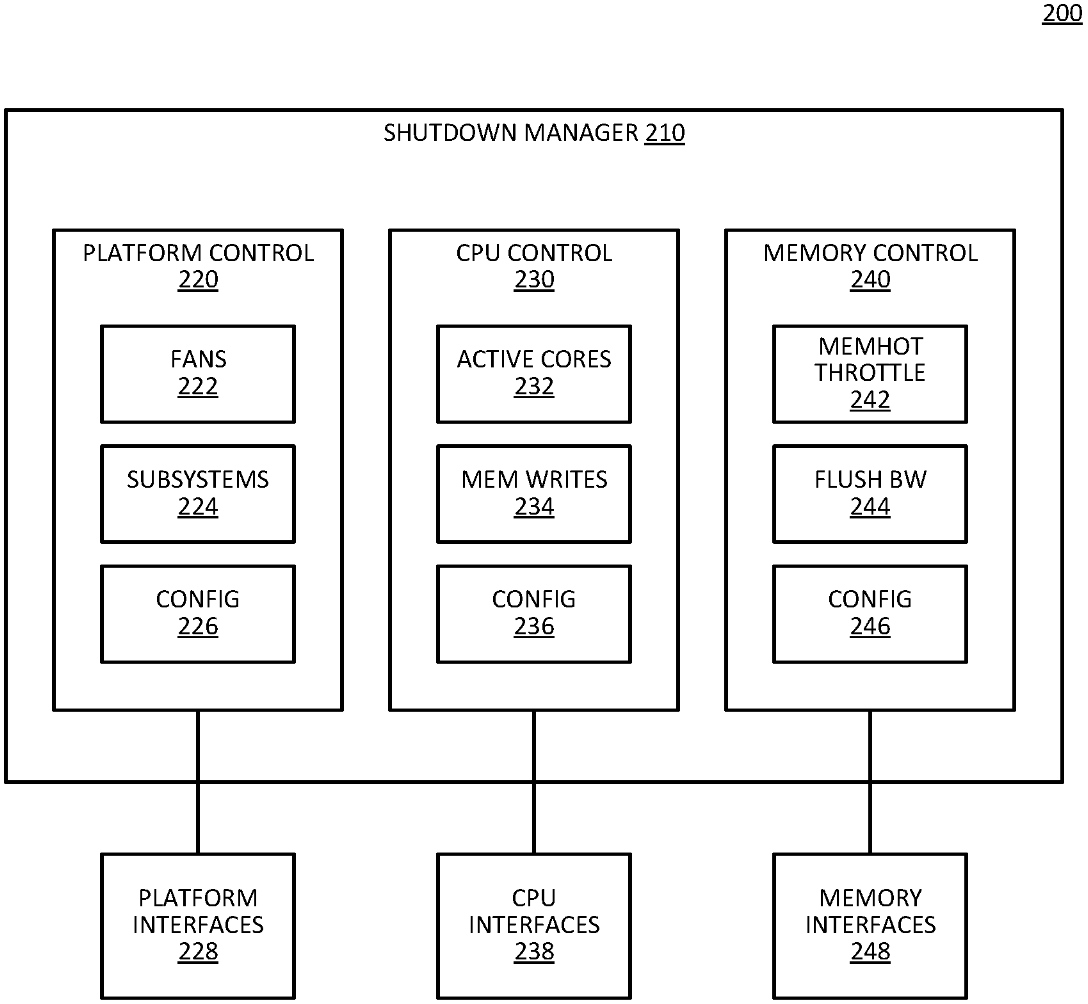
FIG. 2 is a block diagram of an example of a system with configurable settings for a powerdown memory flush.

FIG. 2 is a block diagram of an example of a system with configurable settings for a powerdown memory flush. System 200 provides an example of a shutdown manager in accordance with an example of system 100. Shutdown manager 210 represents code/firmware executed on the hardware platform to respond to a powerdown event.

In one example, shutdown manager 210 is executed by a controller chip of a platform hardware chipset. In one example, shutdown manager 210 is executed by a controller die/tile of a CPU. In one example, shutdown manager 210 generates instructions that are executed by a compute core of the CPU.

Shutdown manager 210 illustrates platform control 220, CPU control 230, and memory control 240, which are components that represent examples of selectable options for management of a powerdown sequence. In one example, shutdown manager 210 includes other components not shown. One or more of the components can be combined. The components can represent configurable options available for shutdown code operations.

In one example, platform control 220 represents configurable options for hardware platform components. For example, fans 222 can represent system fans, which can be controlled for energy saving usage during shutdown, within overheating limits. Subsystems 224 represent solid state drives (SSDs), high power IO, graphics, or other subsystems that consume power during normal operation. For a shutdown routine, in one example, subsystems 224 can be disabled for power saving. Config 226 represents configuration settings related to the platform, which shutdown manager 210 can apply. In one example, config 226 represents configuration in a basic input/output system (BIOS).

In one example, CPU control 230 represents control over components of the CPU, such as cores and system memory interface. For example, active cores 232 represents the ability to select one or more cores of a multicore CPU to actively perform the flush operations, while the other cores remain in low power states. Memory (MEM) writes 234 represents the change in memory writes by the CPU cores. For example, the cores can cease writes to memory ranges outside a range or ranges specified in the configuration settings. Config 236 represents configuration settings related to the CPU, which shutdown manager 210 can apply. In one example, config 236 represents configuration in a basic input/output system (BIOS).

In one example, memory control 240 represents control over components of the memory. For example, memory hot (MEMHOT) throttle 242 represents the ability to throttle the volatile memory bandwidth as the memory heats up or during other memory throttling event such as fADR. Flush bandwidth (BW) 244 represents the ability to throttle the memory bandwidth for flush operations. Config 246 represents configuration settings related to the memory, which shutdown manager 210 can apply. In one example, config 246 represents configuration in a basic input/output system (BIOS).

System 200 includes platform interfaces 228, which represent interfaces between the compute resources, such as the CPU, and the platform devices. Platform interfaces 228 can represent components on the hardware platform to interface with platform components and peripherals. CPU interfaces 238 can represent components on the hardware platform to interface with the CPU. Memory interfaces 248 can represent components on the hardware platform to interface with the memory components. The interfaces enable code on the hardware platform to control hardware that provides power and signals/commands to the different components.

Config 226, config 236, and config 246 can represent configuration settings that are selectable by a user. Thus, rather than statically configuring a system for how it will handle powerdown, the configuration settings enable a user to set the configuration based on the type of backup device to be used. In one example, battery backed fADR users can optimize peak power by reducing the number of CPU cores (e.g., with settings in config 236) and lower the MemHot or fADR/GPF phase 1 throttled bandwidth (e.g., with settings in config 246). In one example, supercapacitor backup solution users can avoid MemHot assertion during system management bus (e.g., SMBus_Alert) signaling by configuration settings related to fADR/GPF phase 1 power (e.g., with settings in config 246). The settings can target maximum power to increase the fADR flush bandwidth, reducing latency. In addition, the number of active cores within each socket can be increased (e.g., with settings in config 236), allowing the platform to use more cores to perform a flush, matching the increased fADR/GPF phase 1 flush bandwidth.

The configurable settings enable a user to reduce power consumption on shutdown, while maximizing the shutdown operations. The configurable settings enable a user to tailor the powerdown sequence with selective features that control the shutdown operation. The use of the configuration settings can enable a system designer to adjust temperature thresholds and/or to adjust system behavior based on knowing how operations affect the temperature. For example, a user can set up the behavior of system fans to reduce how much the fans operate while remaining with a temperature threshold. The temperature threshold be adjusted for shutdown knowing that the time for the shutdown would be short.

Figure 3:
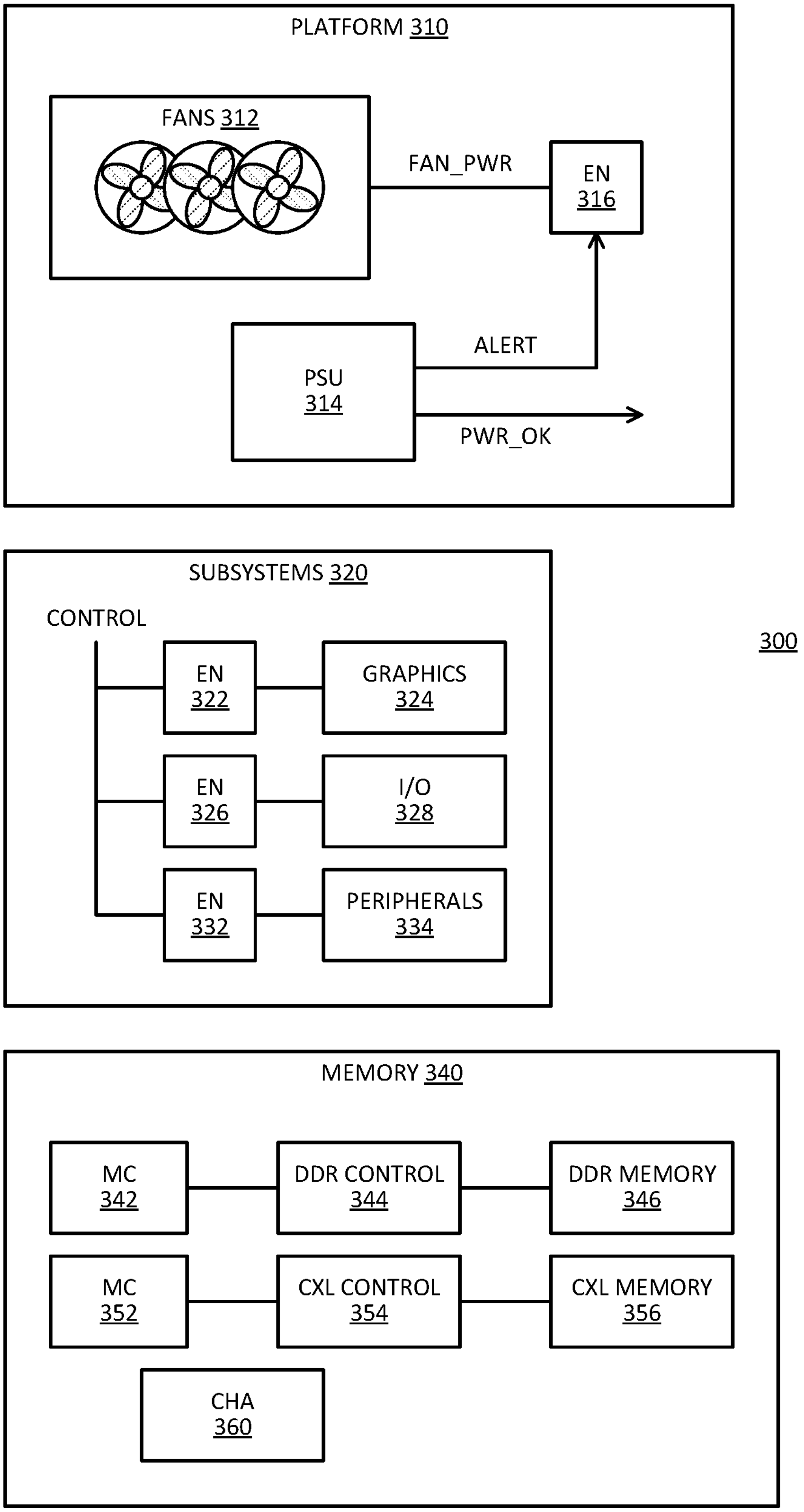
FIG. 3 is a block diagram of an example of configurable subsystem power management for a system powerdown.

FIG. 3 is a block diagram of an example of configurable subsystem power management for a system powerdown. System 300 represents components of a system in accordance with an example of system 100 or system 200.

Platform 310 represents components of the hardware platform of system 300. More specifically, platform 310 represents fans 312 and power supply unit (PSU) 314. Fans 312 represent components that operate to remove heat from the platform. In addition to rotating blade, or alternatively to blades, a system can include pumps to move cooling fluid around the hardware platform for cooling.

PSU 314 represents a power supply. PSU 314 can provide a PWR_OK signal when PSU 314 is operating as expected. In response to an interruption of the operation of PSU 314, the platform can generate an alert signal to control enable (EN) hardware 316. EN hardware 316 can control FAN_PWR to determine when fans 312 are powered during powerdown.

Subsystems 320 represent different subsystems coupled to the hardware platform. In one example, system 300 includes graphics 324, which represents graphics components or graphics/accelerator hardware. Enable (EN) 322 can selectively disable graphics 324 in response to a control signal. In one example, system 300 includes input/output (I/O) 328, which represents high-speed I/O (HSIO) to peripheral components or to other CPUs. Enable (EN) 326 can selectively disable HSIO connections in response to a control signal. Peripherals 334 represent other peripherals that could be connected to system 300. Enable (EN) 332 can selectively disable peripheral connections in response to a control signal.

Memory 340 represents memory system resources for system 300. Memory 340 can include double data rate (DDR) memory 346, which represents volatile system memory, and CXL memory 356, which represents nonvolatile storage. In one example, a memory controller (MC) can manage access to both DDR memory 346 and CXL memory 356. MC 342 represents a memory controller that implements DDR control 344 to manage access to DDR memory 346. MC 352 represents a memory controller that implements CXL control 354 to access CXL memory 346. Memory 340 illustrates caching home agent (CHA) 360, which represents a home agent in the CPU hardware to manage caching for access to various memory resources.

In one example, system 300 can implement various energy optimization techniques for powerdown. Platform 310 enables optional implementation of platform level power reduction to reduce platform power consumption. In response to AC power loss by PSU 314, in one example, platform controls can assert a system management bus alert (e.g., SMBus Alert #) to trigger a system throttle (e.g., PROCHOT # (a processor hot alert), MEMHOT # (a memory hot alert)), as well as turn off fans 312 for a duration of a target fADR flush.

In one example, the system triggers a MEMHOT alert to trigger memory bandwidth throttling. Typically, MEMHOT triggers as a result of sensor readings that indicate the memory has reached a temperature threshold. The system can be configured to trigger the MEMHOT alert regardless of whether the memory has reached the temperature threshold. Thus, the system can utilize MEMHOT as a memory bandwidth throttling mechanism to provide configurable controls for the powerdown sequence. The memory controller can be configured to automatically perform memory bandwidth throttling in response to assertion of the MEMHOT alert; thus, the system triggering the alert can trigger the memory bandwidth throttling.

System fan blanking during the AC power failure reduces fan usage to conserve power. The system thermal time constant is quite slow relative to the time to flush volatile memory. In practice, a system enabled with AC failure fan blanking can lower the temperature threshold for fan speed control, such as allowing a more aggressive fan speed at a lower temperature threshold. For example, reducing the temperature threshold by 1 degree could accommodate extra fADR/GPF flush time, without risking a thermal shutdown (thermtrip) during an AC power failure.

Depending on the mapping of the subsystems and the endpoints, such as SSDs and high power IO, the platform can start disabling subsystems with a signal such as PERST # to trim power demand. In one example, the platform can optionally assert a MemHot # general purpose IO (GPIO) signal to initiate memory thermal throttling to reduce platform peak power. The memory controllers can respond to the MemHot signal and throttle the memory access.

In one example, system 300 can implement CPU power reductions for an fADR flow. In one example, the CPU reduces the number of active cores (e.g., putting one or more cores in a deep power down state) used to carry out cache flush operations. Thus, fewer cores will be involved in flushing data from volatile memory to persistent memory. The number of cores can be selected in accordance with a powerdown policy to match the cache flush memory bandwidth and persistent memory bandwidth.

In one example, the CPU can drop writes to volatile address ranges while keeping DDR memory in self-refresh before flushing the last level cache. In one example, the source within the caching home agent (e.g., CHA 360) handles dropping the volatile memory address by looking up the address range. It will be understood that such checking would incur the cost of comparator logic replicated throughout each CHA instance, or through the use of an additional bit in the address tag. In one example, the MC (e.g., MC 342 and MC 352) can have an fADR mode in which the MC drops writes to DDR volatile addresses entering its write-pending queue. The MC can also keep DDR DIMMs in self-refresh to maximize power saving.

In one example, at the beginning of the fADR flush, the system does not alert persistent memory about the AC power failure during the CPU cache flush. In such an example, the system cannot perform memory throttling within the DIMMs. However, the MC can be triggered to throttle memory bandwidth by the system issuing a MEMHOT alert. In one example, the user can program the MEMHOT throttled bandwidth to the lesser bandwidth of the target fADR bandwidth and the MEMHOT throttled bandwidth.

CXL devices can receive a GPF phase 1 command in the beginning of the cache flush phase without a CXL specification indicating a flush power target. With the programmable configurations described, a user can preprogram the GPF phase 1 power target via BIOS configuration. Upon receiving the GPF phase 1 command, CXL persistent memory can automatically perform power throttling to the GPF phase 1 power specified in the configuration.

Figure 4:
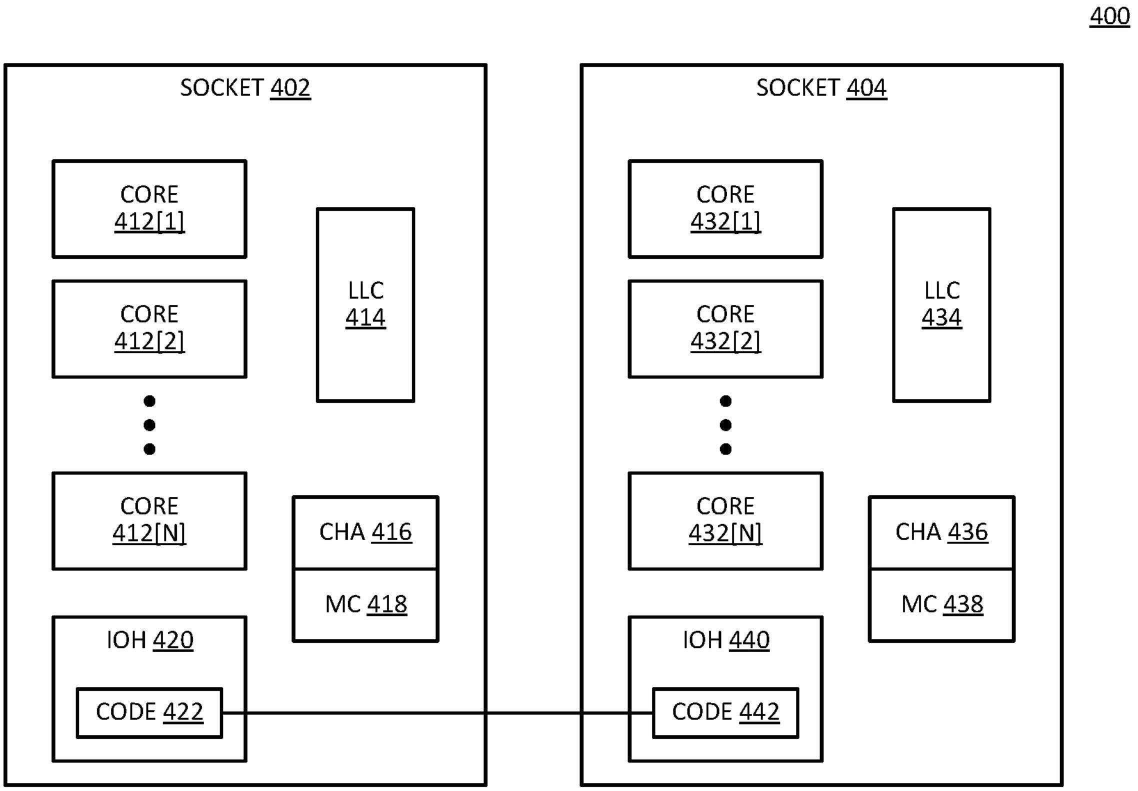
FIG. 4 is a block diagram of an example of a system with socket synchronization for a configurable, power-managed powerdown sequence.

FIG. 4 is a block diagram of an example of a system with socket synchronization for a configurable, power-managed powerdown sequence. System 400 represents a system in accordance with an example of system 100, system 200, or system 300.

System 400 includes multiple sockets, which each include a CPU. Socket 402 represents a CPU with core 412[1], core 412[2], . . . , core 412[N], collectively cores 412. Cores 412 represent compute cores for socket 402. Socket 402 includes last level cache (LLC) 414, which represents a cache shared by cores 412.

In one example, socket 402 includes IO hub (IOH) 420, which represents one or more dies/tiles of the CPU that manage I/O operations for the CPU. IOH 420 is an IO control die for socket 402. In one example, socket 402 includes caching home agent (CHA) 416 or other home agent (such as a home system agent) to manage interaction with off-CPU memory. Memory controller (MC) 418 represents hardware that manages access to system memory.

Socket 404 represents a CPU with core 432[1], core 432[2], . . . , core 432[N], collectively cores 432. Cores 432 represent compute cores for socket 404. Socket 404 includes last level cache (LLC) 434, which represents a cache shared by cores 432. In one example, socket 404 includes IOH 440, which represents one or more dies/tiles of the CPU that manage I/O operations for the CPU of socket 404. IOH 440 is an IO control die for socket 404. In one example, socket 404 includes CHA 436 or other home agent to manage interaction with off-CPU memory. MC 438 represents hardware that manages access to system memory.

During a powerdown sequence, the CPU of socket 402 and the CPU of socket 404 can both perform powerdown operations. Code 422 in IOH 420 represents a shutdown manager in socket 402. Code 442 in IOH 440 represents a shutdown manager in socket 404. In one example, code 422 and code 442 can be considered firmware engines that perform the shutdown operations in accordance with configuration settings that are set by the user for a specific type of backup energy device. During the powerdown sequence, in one example, code 422 and code 442 synchronize their operations.

In one example, in response to detection of a loss of AC power, the hardware platform of system 400 can initiate operation of code 422 and code 442. The IO control dies can then trigger one or more compute cores to perform a flush of data from cache to persistent memory. Code 422 and code 442 can operate in accordance with user configurable settings that trigger a powerdown sequence specific to the type of backup energy device.

Figure 5:
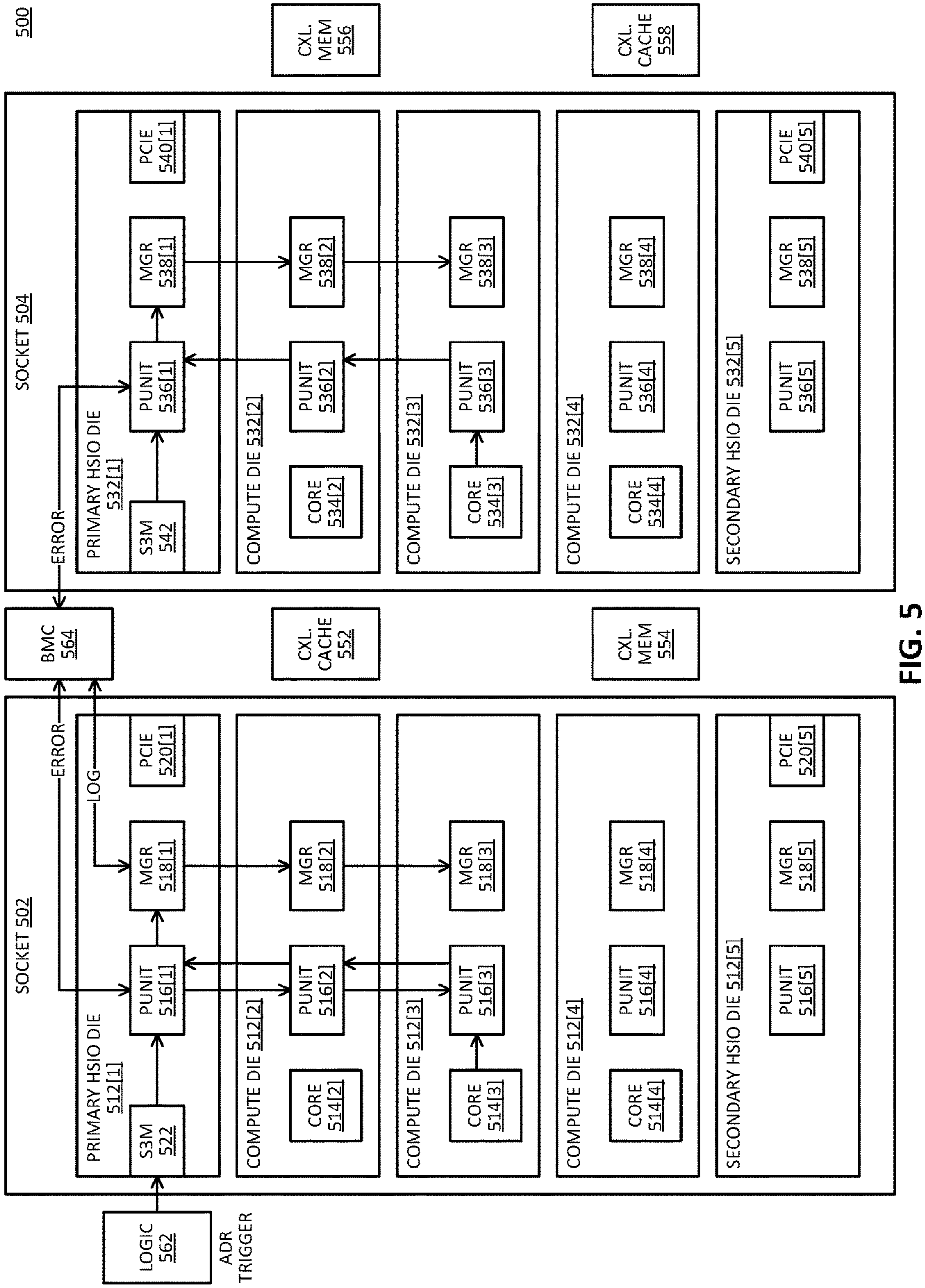
FIG. 5 is a block diagram of an example of a system with a powerdown memory flush.

FIG. 5 is a block diagram of an example of a system with a powerdown memory flush. System 500 represents an example of a system in accordance with system 400. Socket 502 and socket 504 represent sockets on a hardware platform that performs a flush of volatile to nonvolatile memory on powerdown.

In one example, socket 502 includes compute die 512[2], compute die 512[3], and compute die 512[4], collectively compute dies 512. The number of compute dies can be more than what is illustrated. In one example, socket 502 includes primary HSIO die 512[1] and secondary HSIO die [5], which can represent IO controllers or IO hubs for socket 502.

As illustrated, compute die 512[2], compute die 512[3], and compute die 512[4] include core 514[2], core 514[3], and core 514[4], respectively, collectively cores 514, platform unit (PUNIT) 516[2], PUNIT 516[3], and PUNIT 516[4], respectively, collectively P-units 516, and manager (MGR) 518[2], MGR 518[3], and MGR 518[4], respectively, collectively managers 518. Cores 514 represent the compute cores. P-units 516 represent platform communication circuits. Managers 518 represent management modules, such as an out of band management services module (OOBMSM).

Primary HSIO die 512[1] includes S3M, which represents a system management module, PUNIT 516[1], MGR 518 [1], and peripheral component interconnect express (PCIE) 520[1]. PCIE 520[1] represents a PCIe interface manager. Secondary HSIO die 512[5] includes PUNIT 516[5], MGR 518[5], and PCIE 520[5].

In one example, socket 504 includes compute die 532[2], compute die 532[3], and compute die 532[4], collectively compute dies 532. The number of compute dies can be more than what is illustrated. In one example, socket 504 includes primary HSIO die 532[1] and secondary HSIO die [5], which can represent IO controllers or IO hubs for socket 504.

As illustrated, compute die 532[2], compute die 532[3], and compute die 532[4] include core 534[2], core 534[3], and core 534[4], respectively, collectively cores 534, PUNIT 536[2], PUNIT 536[3], and PUNIT 536[4], respectively, collectively P-units 536, and MGR 538[2], MGR 538[3], and MGR 538[4], respectively, collectively managers 538. Cores 534 represent the compute cores. P-units 536 represent platform communication circuits. Managers 538 represent management modules, such as an OOBMSM.

Primary HSIO die 532[1] includes S3M, which represents a system management module, PUNIT 536[1], MGR 538 [1], and PCIE 540[1]. Secondary HSIO die 532[5] includes PUNIT 536[5], MGR 538[5], and PCIE 540[5].

System 500 includes logic 562, which represents logic on the hardware platform that will indicate a power failure and generate an ADR trigger. In one example, logic 562 is a complex programmable logic device (CPLD). Baseboard management controller (BMC) 564 represents a controller for a server system (such as a server rack) of which socket 502 and socket 504 are a part. In one example, system 500 includes CXL.cache 552, CXL.cache 558, CXL.mem 554, and CXL.mem 556, which represent persistent memory interfaces for system 500.

In one example, logic 562 detects a power failure and generates an ADR trigger to cause socket 502 and socket 504 to perform a volatile memory flush. In one example, logic 562 provides the alert to S3M 522 of primary HSIO die 512[1] of socket 502, which can then indicate the error to BMC 564 and S3M 542 and P-unit 536[1] of socket 504. In response to the ADR trigger, P-unit 516[1] and P-unit 536[1] can trigger manager 518[1] and manager 538[1], respectively, to initiate powerdown sequences.

In one example, compute die 512[3] is a primary compute die for socket 502 and compute die 532[3] is a primary compute die for socket 504. The ADR trigger can cause core 514[3] and core 534[3] to initiate flush operations. The P-units can trigger operations of the manager of respective dies for the operations. In one example, the manager 518[1] can interface with BMC 564 to exchange log information, such as a crashlog.

Figure 6A:
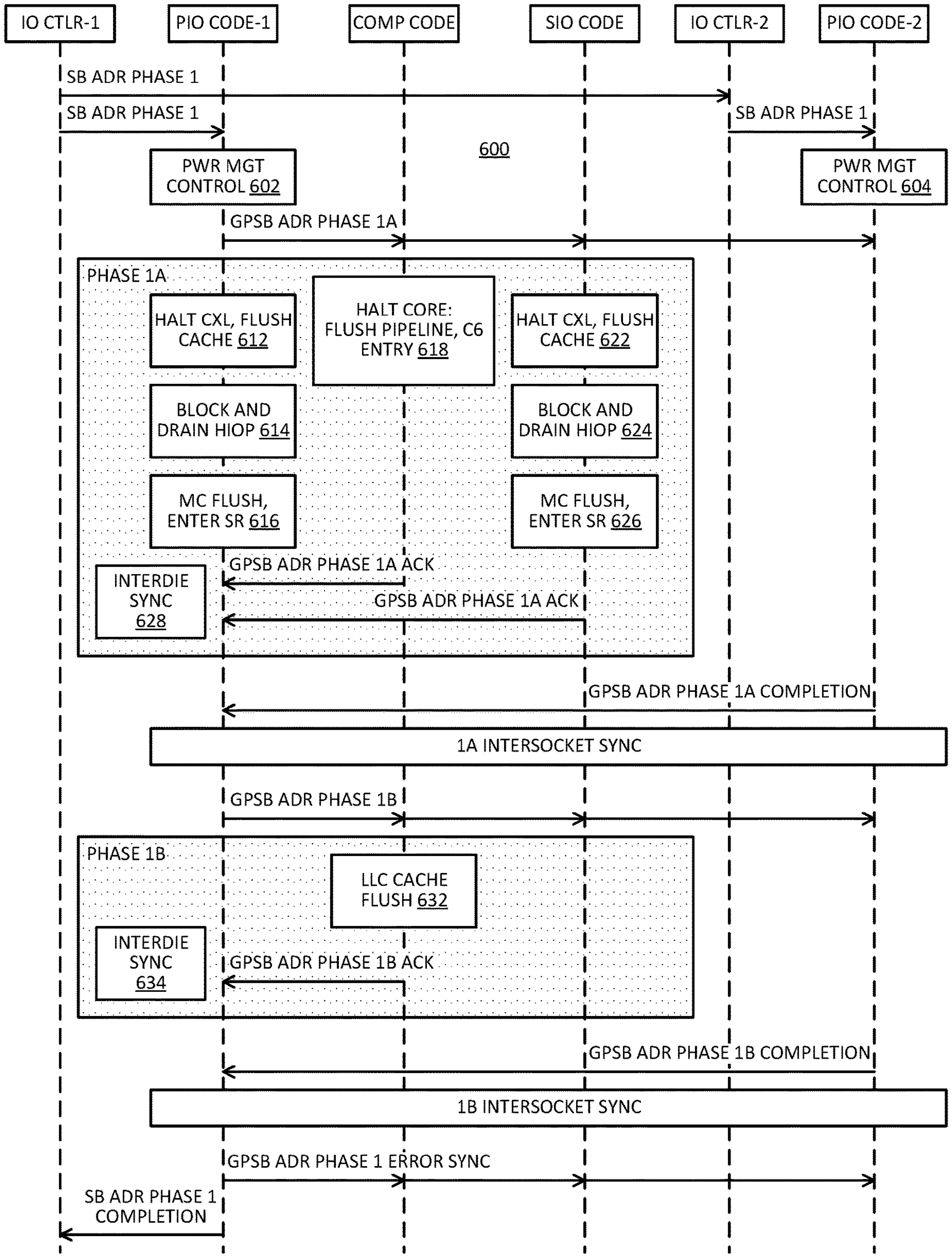
FIGS. 6A-6B represent a flow diagram of an example of a process for powerdown with memory flush.
Figure 6B:
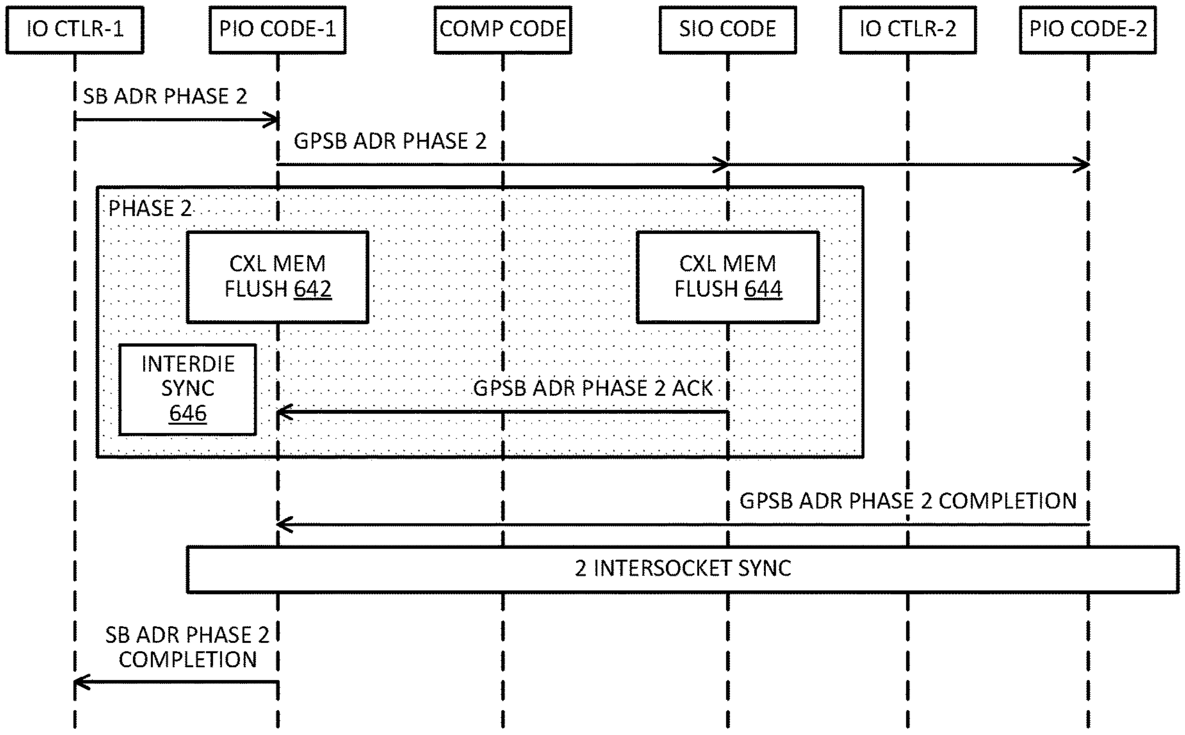

FIGS. 6A-6B represent a flow diagram of an example of a process for powerdown with memory flush. Process 600 represents a powerdown flow in accordance with any system described herein. Process 600 is separated into two pages to capture the entire process, illustrated across the sheets of FIG. 6A and FIG. 6B.

The components that execute process 600 are represented as IO CTLR-1 (IO controller of socket 1), PIO CODE-1 (firmware code for primary IO die of socket 1), COMP CODE (compute code), SIO CODE (firmware code for secondary IO die of socket 1), IO CTLR-2 (IO controller of socket 2), and PIO CODE-2 (firmware code for primary IO die of socket 2). The different components can be replaced by similar components of a hardware platform.

As illustrated in FIG. 6A, in one example, IO CTLR-1 can trigger an ADR Phase 1 operation over a sideband (SB) channel. The ADR trigger can be sent to PIO CODE-1 and PIO CODE-2. At 602, the system can initiate power management (PWR MGT) control with PIO CODE-1. At 604, the system can initiate power management (PWR MGT) control with PIO CODE-2.

The initiation of the ADR can be a general purpose sideband (GPSB) channel ADR Phase 1A as triggered by PIO CODE-1. The GPSB can represent a channel that enables codes across different cores to communicate. In one example, the different codes are codes on different P-units, which can be referred to as p-codes.

Phase 1A of the ADR sequence can include PIO CODE-1 halting CXL and flushing the CXL cache, at 612, block and drain the high-speed IO processor (HIOP), at 614, and perform a memory controller (MC) flush and trigger the DDR memory to enter self-refresh (SR), at 616. Phase 1A can also include PIO CODE-2 halting CXL and flushing the CXL cache, at 622, block and drain the HIOP, at 624, and perform a memory controller flush and trigger the DDR memory to enter self-refresh, at 626.

Phase 1A can include the compute core halting one or more core operations, flushing the pipeline, and trigger one or more cores to enter C6, at 618. In one example, the compute core can acknowledge the ADR Phase 1A, as can the SIO code. Phase 1A can perform an inter-die synchronization, at 628. The synchronization can trigger the completion of Phase 1A from PIO CODE-2.

PIO CODE-1 can initiate a GPSB channel ADR Phase 1B. Phase 1B can include the compute core code performing an LLC cache flush, at 632. The core can acknowledge Phase 1B and the system performs an inter-die sync, at 634. The synchronization can trigger the completion of Phase 1B from PIO CODE-2. After Phase 1A and Phase 1B, PIO CODE-1 can indicate the completion of SB ADR Phase 1.

As illustrated in FIG. 6B, in one example, IO CTLR-1 can trigger an ADR Phase 2 operation over a sideband (SB) channel. PIO CODE-1 can generate a GPSB channel ADR Phase 2 portion of the powerdown sequence. In Phase 2, PIO CODE-1 can perform a CXL memory flush, at 642. SIO CODE can also perform a CXL memory flush, at 644. The SIO CODE can acknowledge the ADR Phase 2, and the system can perform an inter-die synchronization, at 646. The synchronization can trigger the completion of Phase 2 from PIO CODE-2. After the synchronization, PIO CODE-1 can indicate the completion of SB ADR Phase 2. The different phases enable the platform to determine what operations to perform and how to manage the powerdown sequence based on the configuration settings for the system.

Figure 7:
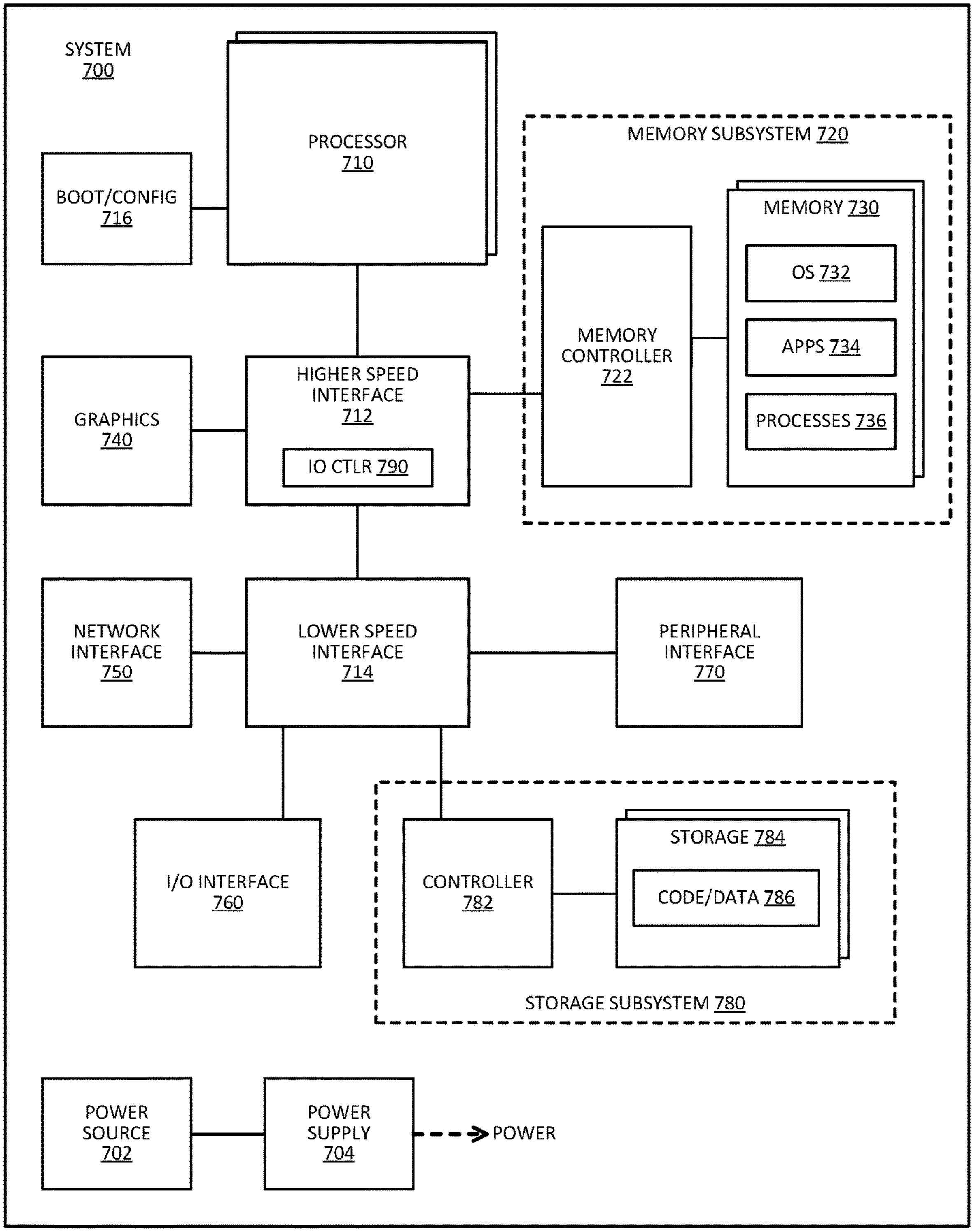
FIG. 7 is a block diagram of an example of a computing system in which powerdown with memory flush can be implemented.

FIG. 7 is a block diagram of an example of a computing system in which powerdown with memory flush can be implemented. System 700 represents a computing device in accordance with any example herein, and can be a laptop computer, a desktop computer, a tablet computer, a server, a gaming or entertainment control system, embedded computing device, or other electronic device.

System 700 represents a computer system that can perform a volatile memory flush based on configuration for a type of energy backup device in accordance with any example herein. In one example, system 700 includes IO controller (CTLR) 790 in higher speed interface 712. In one example, interface 712 represents an IO controller die in a CPU. IO controller 790 can perform a powerdown sequence with configurable controls that determine how power is managed based on selectable settings in accordance with any example herein.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include standalone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary interfaces. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, NAND, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
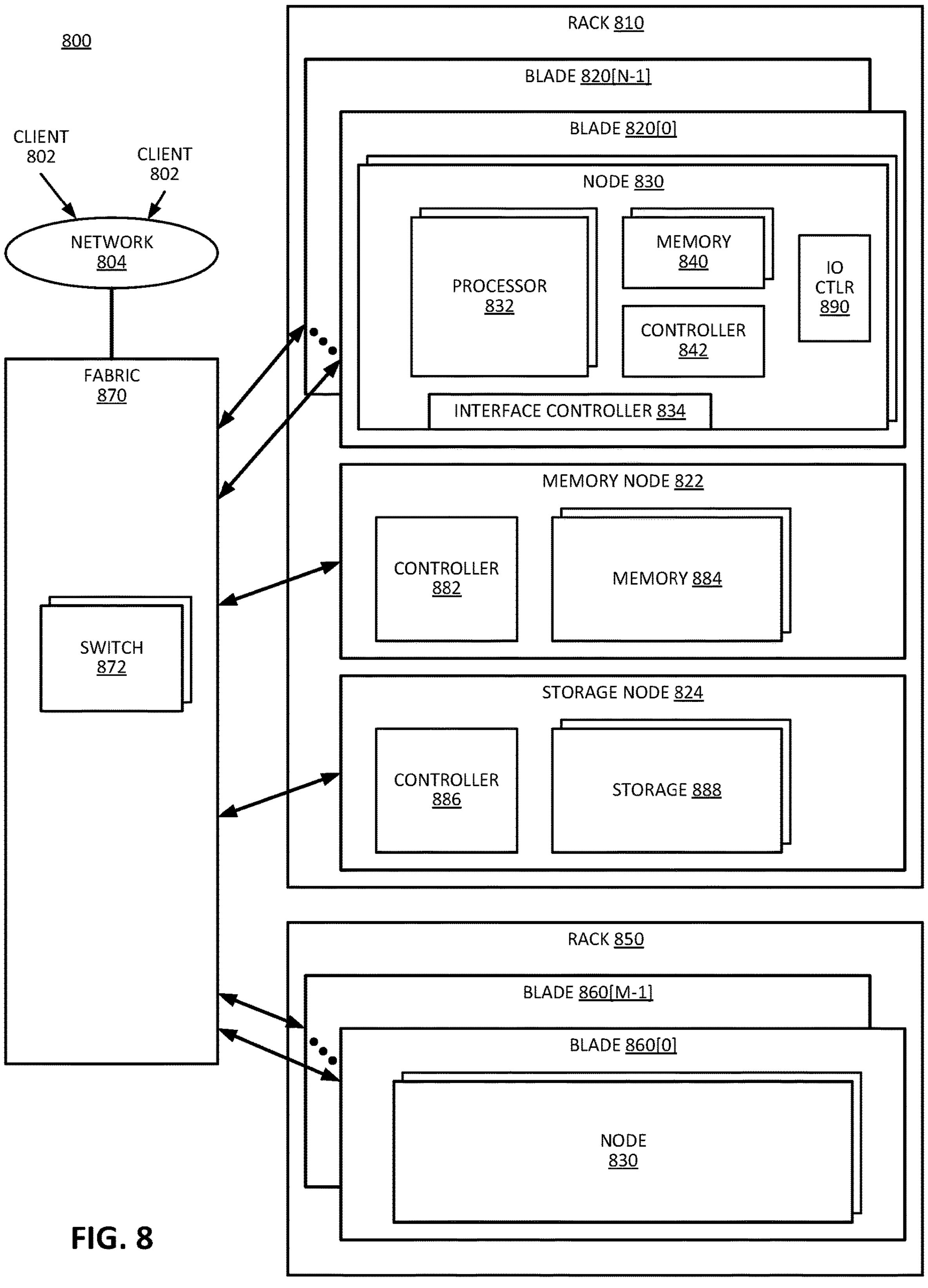
FIG. 8 is a block diagram of an example of a multi-node network in which powerdown with memory flush can be implemented.

FIG. 8 is a block diagram of an example of a multi-node network in which powerdown with memory flush can be implemented. System 800 represents a network of nodes. In one example, system 800 represents a data center. In one example, system 800 represents a server farm. In one example, system 800 represents a data cloud or a processing cloud.

System 800 includes node 830, which represents a computer system that can perform a volatile memory flush based on configuration for a type of energy backup device in accordance with any example herein. In one example, node 830 includes IO controller (CTLR) 890. In one example, IO controller 890 represents an IO controller die in a CPU of node 830. IO controller 890 can perform a powerdown sequence with configurable controls that determine how power is managed based on selectable settings in accordance with any example herein.

One or more clients 802 make requests over network 804 to system 800. Network 804 represents one or more local networks, or wide area networks, or a combination. Clients 802 can be human or machine clients, which generate requests for the execution of operations by system 800. System 800 executes applications or data computation tasks requested by clients 802.

In one example, system 800 includes one or more racks, which represent structural and interconnect resources to house and interconnect multiple computation nodes. In one example, rack 810 includes multiple nodes 830. In one example, rack 810 hosts multiple blade components, blade 820[0], . . . , blade 820[N−1], collectively blades 820. Hosting refers to providing power, structural or mechanical support, and interconnection. Blades 820 can refer to computing resources on printed circuit boards (PCBs), where a PCB houses the hardware components for one or more nodes 830. In one example, blades 820 do not include a chassis or housing or other "box" other than that provided by rack 810. In one example, blades 820 include housing with exposed connector to connect into rack 810. In one example, system 800 does not include rack 810, and each blade 820 includes a chassis or housing that can stack or otherwise reside in close proximity to other blades and allow interconnection of nodes 830.

System 800 includes fabric 870, which represents one or more interconnectors for nodes 830. In one example, fabric 870 includes multiple switches 872 or routers or other hardware to route signals among nodes 830. Additionally, fabric 870 can couple system 800 to network 804 for access by clients 802. In addition to routing equipment, fabric 870 can be considered to include the cables or ports or other hardware equipment to couple nodes 830 together. In one example, fabric 870 has one or more associated protocols to manage the routing of signals through system 800. In one example, the protocol or protocols is at least partly dependent on the hardware equipment used in system 800.

As illustrated, rack 810 includes N blades 820. In one example, in addition to rack 810, system 800 includes rack 850. As illustrated, rack 850 includes M blade components, blade 860[0], . . . , blade 860[M−1], collectively blades 860. M is not necessarily the same as N; thus, it will be understood that various different hardware equipment components could be used, and coupled together into system 800 over fabric 870. Blades 860 can be the same or similar to blades 820. Nodes 830 can be any type of node and are not necessarily all the same type of node. System 800 is not limited to being homogenous, nor is it limited to not being homogenous.

The nodes in system 800 can include compute nodes, memory nodes, storage nodes, accelerator nodes, or other nodes. Rack 810 is represented with memory node 822 and storage node 824, which represent shared system memory resources, and shared persistent storage, respectively. One or more nodes of rack 850 can be a memory node or a storage node.

Nodes 830 represent examples of compute nodes. For simplicity, only the compute node in blade 820[0] is illustrated in detail. However, other nodes in system 800 can be the same or similar. At least some nodes 830 are computation nodes, with processor (proc) 832 and memory 840. A computation node refers to a node with processing resources (e.g., one or more processors) that executes an operating system and can receive and process one or more tasks. In one example, at least some nodes 830 are server nodes with a server as processing resources represented by processor 832 and memory 840.

Memory node 822 represents an example of a memory node, with system memory external to the compute nodes. Memory nodes can include controller 882, which represents a processor on the node to manage access to the memory. The memory nodes include memory 884 as memory resources to be shared among multiple compute nodes.

Storage node 824 represents an example of a storage server, which refers to a node with more storage resources than a computation node, and rather than having processors for the execution of tasks, a storage server includes processing resources to manage access to the storage nodes within the storage server. Storage nodes can include controller 886 to manage access to the storage 888 of the storage node.

In one example, node 830 includes interface controller 834, which represents logic to control access by node 830 to fabric 870. The logic can include hardware resources to interconnect to the physical interconnection hardware. The logic can include software or firmware logic to manage the interconnection. In one example, interface controller 834 is or includes a host fabric interface, which can be a fabric interface in accordance with any example described herein. The interface controllers for memory node 822 and storage node 824 are not explicitly shown.

Processor 832 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 840 can be or include memory devices represented by memory 840 and a memory controller represented by controller 842.

Example 1 is an apparatus comprising: a volatile memory; a persistent memory to store data persistently; an energy backup device to provide energy to flush data from the volatile memory to the persistent memory in response to detection of a powerdown event; and platform hardware to execute a powerdown sequence in response to detection of the powerdown event, to manage power usage during the powerdown sequence and manage the flush of data from the volatile memory to the persistent memory.

Example 2 is an apparatus in accordance with Example 1, wherein the platform hardware is to manage the power usage during the powerdown sequence based on user selectable configuration settings.

Example 3 is an apparatus in accordance with Example 2, wherein the selectable configuration settings include platform settings to configure power usage for platform components.

Example 4 is an apparatus in accordance with Example 3, wherein the platform components comprise system fans.

Example 5 is an apparatus in accordance with Example 2, wherein the selectable configuration settings include central processing unit (CPU) power configuration settings to configure power usage for the CPU.

Example 6 is an apparatus in accordance with Example 5, wherein the CPU power configuration settings comprise a setting to disable a CPU core for the powerdown sequence.

Example 7 is an apparatus in accordance with Example 2, wherein the selectable configuration settings include memory settings to configure power usage for memory components.

Example 8 is an apparatus in accordance with Example 7, wherein the memory settings comprise a setting to place system memory in self-refresh prior to a cache flush and drop writes to volatile address ranges.

Example 9 is an apparatus in accordance with Example 7, wherein the memory settings comprise a setting to throttle memory bandwidth.

Example 10a is an apparatus in accordance with any preceding example of the apparatus, further comprising a multicore processor, wherein only a single computing core of the multicore processor is enabled to perform the flush of data.

Example 10b is an apparatus in accordance with any preceding example of the apparatus, further comprising a multicore processor, wherein a number of computing cores of the multicore processor are enabled to perform the flush of data to match a transfer bandwidth available.

Example 11 is an apparatus in accordance with any preceding example of the apparatus, wherein the energy backup device comprises a battery, and wherein the platform hardware is to manage the power usage during the powerdown sequence with a policy specific to battery backup.

Example 12a is an apparatus in accordance with any preceding example of the apparatus, wherein the energy backup device comprises a supercapacitor, and wherein the platform hardware is to manage the power usage during the powerdown sequence with a policy specific to supercapacitor backup.

Example 12b is an apparatus in accordance with any preceding example of the apparatus, wherein the platform hardware is to trigger assert a MEMHOT alert to trigger memory bandwidth throttling.

Example 13 is a computer system, comprising: a volatile memory; a persistent memory to store data persistently; an energy backup device to provide energy to flush data from the volatile memory to the persistent memory in response to detection of a powerdown event; a central processing unit (CPU) having multiple compute cores and an input/output (IO) control die, the IO control die to receive an indication of the detection of the powerdown event, trigger one of the compute cores to perform a flush of data from the volatile memory to the persistent memory, and execute a powerdown sequence specific to a type of the energy backup device.

Example 14 is a computer system in accordance with Example 13, wherein the powerdown sequence includes a configurable setting for system fans and platform subsystems specific to the type of the energy backup device.

Example 15 is a computer system in accordance with any preceding example of the computer system, wherein the powerdown sequence includes a configurable setting for CPU core usage and system memory usage specific to the type of the energy backup device.

Example 16 is a computer system in accordance with any preceding example of the computer system, wherein the powerdown sequence includes a configurable setting for memory bandwidth specific to the type of the energy backup device.

Example 17 is a computer system in accordance with any preceding example of the computer system, wherein the powerdown sequence includes a configurable setting for memory refresh and cache flush specific to the type of the energy backup device.

Example 18 is a computer system in accordance with any preceding example of the computer system, wherein the energy backup device comprises a battery, and wherein the powerdown sequence is to manage power usage with a policy specific to battery backup.

Example 19a is a computer system in accordance with any preceding example of the computer system, wherein the energy backup device comprises a supercapacitor, and wherein the powerdown sequence is to manage power usage with a policy specific to supercapacitor backup.

Example 19b is a computer system in accordance with any preceding example of the computer system, wherein the energy backup device comprises a battery or a supercapacitor, and wherein the powerdown sequence is to manage power usage with a policy specific to battery backup or supercapacitor backup, respectively.

Example 19c is a computer system in accordance with any preceding example of the computer system, wherein the powerdown sequence includes asserting a MEMHOT alert to trigger memory bandwidth throttling.

Example 20 is a computer system in accordance with any preceding example of the computer system, wherein the CPU comprises a first CPU, the multiple compute cores comprise first compute cores, and the IO control die comprises a first IO control die, and further comprising: a second CPU having multiple second compute cores and a second IO control die, the second IO control die to trigger one of the second compute cores to perform a flush of data from the volatile memory to the persistent memory, and perform a synchronization of the powerdown sequence with the first IO control die.

Example 21 is a method comprising: detecting a powerdown event; providing energy from an energy backup device to flush data from a volatile memory to a persistent memory in response to detection of the powerdown event; and executing a powerdown sequence in response to detection of the powerdown event, to manage power usage during the powerdown sequence and manage the flush of data from the volatile memory to the persistent memory.

Example 22 is a method in accordance with Example 21, executing the powerdown sequence comprises managing the power usage during the powerdown sequence based on user selectable configuration settings.

Example 23 is a method in accordance with Example 22, wherein the selectable configuration settings include platform settings to configure power usage for platform components.

Example 24 is a method in accordance with Example 23, wherein the platform components comprise system fans.

Example 25 is a method in accordance with Example 22, wherein the selectable configuration settings include central processing unit (CPU) power configuration settings to configure power usage for the CPU.

Example 26 is a method in accordance with Example 25, wherein the CPU power configuration settings comprise a setting to disable a CPU core for the powerdown sequence.

Example 27 is a method in accordance with Example 22, wherein the selectable configuration settings include memory settings to configure power usage for memory components.

Example 28 is a method in accordance with Example 27, wherein the memory settings comprise a setting to place system memory in self-refresh prior to a cache flush and drop writes to volatile address ranges.

Example 29 is a method in accordance with Example 27, wherein the memory settings comprise a setting to throttle memory bandwidth.

Example 30 is a method in accordance with any preceding example of the method, comprising enabling only a single computing core of a multicore processor to perform the flush of data.

Example 31 is a method in accordance with any preceding example of the method, comprising enabling a number of computing cores of a multicore processor to perform the flush of data based on an amount of transfer bandwidth available to perform the flush of data.

Example 32 is a method in accordance with any preceding example of the method, wherein the energy backup device comprises a battery, and wherein the platform hardware is to manage the power usage during the powerdown sequence with a policy specific to battery backup.

Example 33 is a method in accordance with any preceding example of the method, wherein the energy backup device comprises a supercapacitor, and wherein the platform hardware is to manage the power usage during the powerdown sequence with a policy specific to supercapacitor backup.

Example 34 is a method in accordance with any preceding example of the method, wherein the powerdown sequence includes asserting a MEMHOT alert to trigger memory bandwidth throttling.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
- a volatile memory;
- a persistent memory to store data persistently;
- an energy backup device to provide energy to flush data from the volatile memory to the persistent memory in response to detection of a powerdown event;
- platform hardware to execute a powerdown sequence in response to detection of the powerdown event, to manage power usage during the powerdown sequence and manage the flush of data from the volatile memory to the persistent memory; and
- a multicore processor, wherein a number of computing cores of the multicore processor are enabled to match a memory flush bandwidth to perform the flush of data.

2. The apparatus of claim 1, wherein the platform hardware is to manage the power usage during the powerdown sequence based on user selectable configuration settings.

3. The apparatus of claim 2, wherein the selectable configuration settings include platform settings to configure power usage for platform components, including system fans.

4. The apparatus of claim 2, wherein the selectable configuration settings include central processing unit (CPU) power configuration settings to configure power usage for the CPU.

5. The apparatus of claim 4, wherein the CPU power configuration settings comprise a setting to disable a CPU core for the powerdown sequence.

6. The apparatus of claim 2, wherein the selectable configuration settings include memory settings to configure power usage for memory components.

7. The apparatus of claim 6, wherein the memory settings comprise a setting to place system memory in self-refresh prior to a cache flush and drop writes to volatile address ranges.

8. The apparatus of claim 6, wherein the memory settings comprise a setting to throttle memory bandwidth.

9. The apparatus of claim 1, wherein the energy backup device comprises a battery, and wherein the platform hardware is to manage the power usage during the powerdown sequence with a policy specific to battery backup.

10. The apparatus of claim 1, wherein the energy backup device comprises a supercapacitor, and wherein the platform hardware is to manage the power usage during the powerdown sequence with a policy specific to supercapacitor backup.

11. The apparatus of claim 1, wherein the platform hardware is to trigger assert a MEMHOT alert to trigger memory bandwidth throttling.

12. A computer system, comprising:

a volatile memory;

a persistent memory to store data persistently;

an energy backup device to provide energy to flush data from the volatile memory to the persistent memory in response to detection of a powerdown event;

a first central processing unit (CPU) having multiple first compute cores and first input/output (IO) control die, the first IO control die to receive an indication of the detection of the powerdown event, trigger one of the first compute cores to perform a flush of data from the volatile memory to the persistent memory, and execute a powerdown sequence specific to a type of the energy backup device; and a second CPU having multiple second compute cores and a second IO control die, the second IO control die to trigger one of the second compute cores to perform a flush of data from the volatile memory to the persistent memory, and perform a synchronization of the powerdown sequence with the first IO control die.

13. The computer system of claim 12, wherein the powerdown sequence includes a configurable setting for system fans and platform subsystems specific to the type of the energy backup device.

14. The computer system of claim 12, wherein the powerdown sequence includes a configurable setting for CPU core usage and system memory usage specific to the type of the energy backup device.

15. The computer system of claim 12, wherein the powerdown sequence includes a configurable setting for memory bandwidth specific to the type of the energy backup device.

16. The computer system of claim 12, wherein the powerdown sequence includes a configurable setting for memory refresh and cache flush specific to the type of the energy backup device.

17. The computer system of claim 12, wherein the energy backup device comprises a battery or a supercapacitor, and wherein the powerdown sequence is to manage power usage with a policy specific to battery backup or supercapacitor backup, respectively.

18. The computer system of claim 12, wherein the powerdown sequence includes asserting a MEMHOT alert to trigger memory bandwidth throttling.

* * * * *